(12) United States Patent
Ikeda

(10) Patent No.: US 7,221,583 B2
(45) Date of Patent: May 22, 2007

(54) MAGNETIC FILM, MULTILAYER MAGNETIC FILM, METHOD AND MECHANISM OF MAGNETIZATION INVERSION OF MAGNETIC FILM, AND MAGNETIC RANDOM ACCESS MEMORY

(75) Inventor: Takashi Ikeda, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 249 days.

(21) Appl. No.: 10/929,465

(22) Filed: Aug. 31, 2004

(65) Prior Publication Data
US 2005/0047262 A1    Mar. 3, 2005

(30) Foreign Application Priority Data
Sep. 3, 2003    (JP)    .............. 2003-311307

(51) Int. Cl.
*G11C 11/00* (2006.01)
(52) U.S. Cl. .............. 365/158; 365/171; 365/173
(58) Field of Classification Search ............ 365/158, 365/171, 173
See application file for complete search history.

(56) References Cited

U.S. PATENT DOCUMENTS

| | | | |
|---|---|---|---|
| 5,574,279 A | 11/1996 | Ikeda | .............. 250/306 |
| 5,923,637 A | 7/1999 | Shimada | .............. 369/126 |
| 6,219,275 B1 | 4/2001 | Nishimura | .............. 365/173 |
| 6,381,171 B1 * | 4/2002 | Inomata et al. | .............. 365/173 |
| 2004/0052006 A1 * | 3/2004 | Odagawa et al. | .............. 360/324.1 |

FOREIGN PATENT DOCUMENTS

JP    11-213650    8/1999

* cited by examiner

*Primary Examiner*—Son Dinh
(74) *Attorney, Agent, or Firm*—Fitzpatrick, Cella, Harper & Scinto

(57) ABSTRACT

A magnetic random access memory capable of writing information with a small write current is provided. A magnetic film or a multilayer magnetic film of the present invention has a part where the magnetization inversion is relatively easier than in the other parts. A magnetization inversion mechanism of the magnetic film of the invention has an application protrusion for applying a stronger magnetic field to a part of the magnetic film than to the other parts thereof. The magnetic random access memory of the invention includes a magnetoresistive film having the multilayer magnetic film as a memory element or the magnetization inversion mechanism as a writing unit.

3 Claims, 3 Drawing Sheets

MAGNETIC FILM, MULTILAYER MAGNETIC FILM, METHOD AND MECHANISM OF MAGNETIZATION INVERSION OF MAGNETIC FILM, AND MAGNETIC RANDOM ACCESS MEMORY

BACKGROUND OF THE INVENTION

1. Field of the Invention

The present invention relates to a magnetic film, a method of magnetization inversion of a magnetic film, a mechanism of magnetization inversion of a magnetic film and a magnetic random access memory.

2. Description of Related Art

In recent years, it is expected that a magnetic random access memory (MRAM) is used instead of many conventional solid state memories. The MRAM is a high-speed nonvolatile memory using the magnetoresistive effect based on the electron spin dependent conduction phenomenon in the nano-technology. Especially, research reports recently issued have substantiated the high practicability of the MRAM which, using the spin tunneling magnetoresistive (TMR) effect, can produce a large read signal and find advantageous application for high-density recording or high-speed read operation.

In the MRAM, a magnetoresistive film is used as a memory element. The magnetoresistive film is basically configured of a sandwich structure, as shown in FIG. 5, in which two magnetic films B, C are stacked and sandwich a nonmagnetic film A. The resistance value of the MRAM is varied with the direction of magnetization of the transition metal atoms of the two magnetic films B, C (hereinafter simply referred to as "the direction of magnetization of the magnetic films") formed in contact with the nonmagnetic film A. Specifically, when the direction of magnetization is the same (parallel) for the two magnetic films B, C, the resistance value is comparatively small, while when the direction of magnetization is opposite (antiparallel), the resistance value is comparatively large. The MRAM reads the information using this characteristic. The information is written, for example, on the assumption that "0" is involved when the directions of magnetization of the two magnetic films B, C are parallel to each other, while "1" is indicated when the directions are antiparallel. The information is written in such a manner that the magnetic film C is magnetized in the direction corresponding to the information to be recorded, while the direction of magnetization of the other magnetic film B is fixed. When a constant voltage is applied to a magnetoresistive film having recorded therein "0", a comparatively large current flows in the particular magnetoresistive film, while a comparatively small current flows when "1" is recorded in the magnetoresistive film. This difference in current value is detected by a sense amplifier thereby to judge whether the recorded information is "0" or "1". In this way, the information can be read out.

In the case of the MRAM using an in-plane magnetized film as a magnetic film, the reduction in size of the memory element to improve the recording density poses the problem that the information cannot be held due to the effect of the demagnetizing field or the curling of magnetization at the end surface. Specifically, the magnitude of the saturated magnetization of the magnetoresistive film such as NiFe/Cu/Co is not less than about 800 [emu/cc]($(1/4_\pi) \times 10^4$ [emu]=1 [Wb/m$^2$]). Once the width of the memory element is reduced to the order of submicrons, the demagnetizing field increases due to the approach of the magnetic pole of the film end surface, with the result that the spin is reversed at the film end surface and oriented in the direction parallel to the side surface.

A solution to this problem of the in-plane magnetized film may be to form a rectangular magnetic film. This method, however, cannot reduce the size of the memory element and therefore cannot be expected to sufficiently improve the recording density. A method to avoid this problem by use of a vertical magnetized film has been proposed as described in, for example, Japanese Patent Application Laid-Open No. 11-213650 (US6219275). The magnitude of the saturated magnetization for the vertical magnetized film is controlled to a maximum of about 300 [emu/cc], and the energy of the demagnetizing field is smaller than the vertical magnetic anisotropy constant. Even when the width of the memory element is reduced, therefore, no approach of the magnetic pole of the film end surface occurs and the demagnetizing field is not increased. For this reason, a MRAM smaller in size than the MRAM using a memory element formed of an in-plane magnetized film can be implemented. An amorphous alloy film of the rare-earth metal or the transition metal is suitable for the vertical magnetized film used as a memory element of MRAM. The rare-earth metals generally used for this purpose include Gd and Tb, while the transition metals include Fe and Co.

In recording information in the MRAM, a write current is supplied to a write line arranged near a memory element (magnetoresistive element), and by use of the magnetic field generated by the write current, one of the magnetic films is magnetized in the direction corresponding to the information to be recorded. The magnetic field currently required to reverse the direction of magnetization of the magnetic film (magnetic flux reversal) is about several tens of [Oe] (1[Oe]=79.6 [A/m]). For the magnetic field of this size to be applied to the memory element, however, a comparatively large write current is required to be supplied to the write line, and depending on the sectional area of the write line, the current density is exceeded at which the wire may be broken by migration or the like. That is, although a compact MRAM can be realized by use of a memory element formed of a vertical magnetized film, the limit of the write current that can be supplied to the write line poses the new problem that information cannot be recorded in the memory element, while at the same time increasing the power consumption. This problem can be solved by increasing the sectional area of the write line at the sacrifice of running counter to the requirement to reduce the size of the memory as a whole on the one hand and the failure to solve the problem of an increased power consumption on the other.

SUMMARY OF THE INVENTION

When a uniform magnetic field is applied to a magnetic film, and a magnetic domain is formed by a local magnetization inversion occurring in a part of the magnetic film, immediately after which the magnetic domain is enlarged to cause the magnetization inversion of the whole magnetic film. This phenomenon is specifically explained with reference to the magnetic film C shown in FIG. 5. Upon application a magnetic field to the magnetic film C in the direction antiparallel to the direction of magnetization, the magnetic film C transfers to a state of high energy. With the subsequent gradual increase in the external magnetic field, as shown in FIG. 6A, a local magnetization inversion occurs in the magnetic film C and a minor magnetic domain D is formed. This minor magnetic domain D thus formed is instantaneously enlarged (FIG. 6B) by the surrounding stray field in addition to the external magnetic field (FIG. 6B), thereby reversing the magnetization of the whole magnetic film C (FIG. 6C). As described above, the magnetization inversion of the magnetic film is caused by the fact that a minor magnetic domain is formed in the magnetic film.

An object of this invention is to solve at least one of the aforementioned problems by using the above-mentioned characteristics of the magnetic film, or in particular to provide a magnetic film and a multilayer magnetic film in which a magnetization inversion is caused by a weaker magnetic field than in the related art. Another object of the invention is to provide a method and a mechanism capable of causing a magnetization inversion of the magnetic film with a smaller current than in the related art. Still another object of the invention is to provide a MRAM capable of recording information with a smaller write current than in the related art.

In order to achieve the above objects, according to this invention, there is provided a magnetic film or a multilayer magnetic film, primarily characterized by including a part where the magnetization inversion is relatively easier than in the other parts.

In order to achieve the above objects, according to this invention, there is provided a method of magnetization inversion of a magnetic film, characterized in that a magnetic field is applied to the whole of the magnetic film, and a magnetic field stronger than the magnetic field applied to the whole of the magnetic film is locally applied to a part of the magnetic film thereby magnetizing the magnetic film in the same direction as the magnetic field applied.

In order to achieve the above objects, according to this invention, there is provided a magnetization inversion mechanism for a magnetic film, primarily characterized in that a part of the magnetic film has an application protrusion to which a stronger magnetic field is applied than that applied to the other parts of the magnetic film.

In order to achieve the above objects, according to this invention, there is provided a magnetic random access memory, primarily characterized in that a magnetoresistive film composed of the multilayer magnetic film constitutes a memory element, or characterized by using the above magnetization inversion method, or characterized in that the magnetization inversion mechanism constitutes means for writing information.

DESCRIPTION OF THE PREFERRED EMBODIMENTS

First Embodiment

Figure 1:
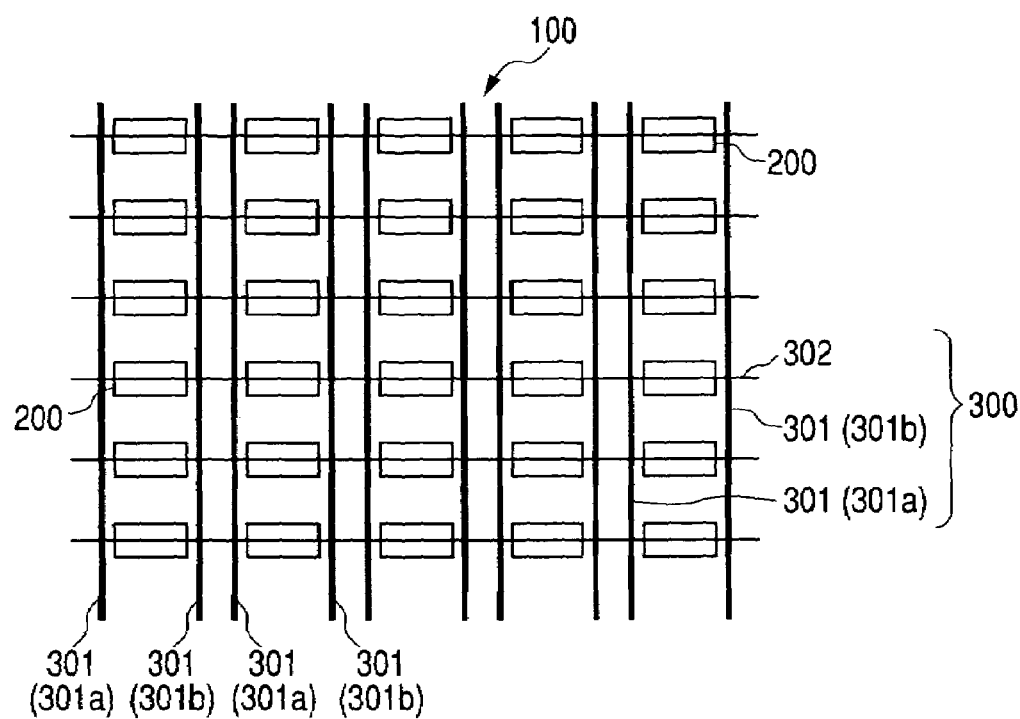
FIG. 1 is a schematic diagram showing an example of a magnetic random access memory according to an embodiment of the invention.
Figure 2:
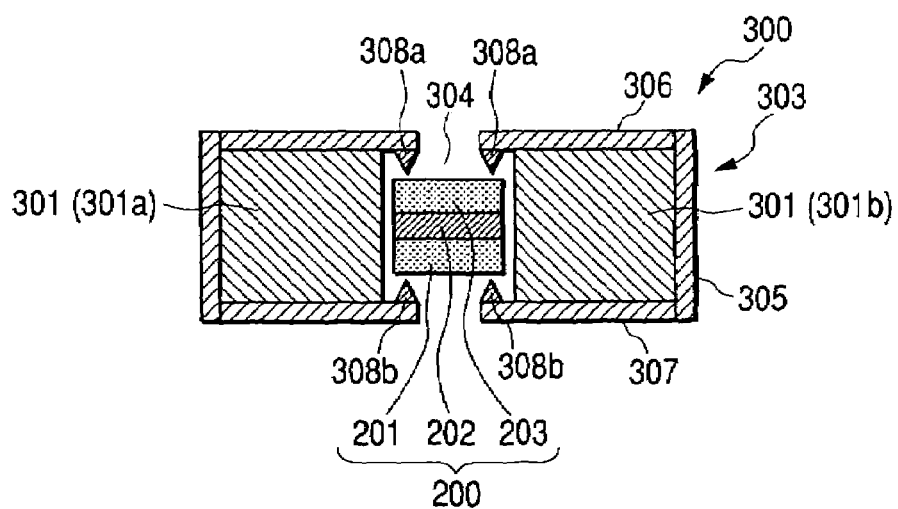
FIG. 2 is an enlarged sectional view schematically showing a plurality of memory elements and a plurality of magnetization inversion mechanisms making up the magnetic random access memory shown in FIG. 1.

An example of the magnetic random access memory according to a most preferred embodiment of the invention is explained in detail with reference to FIGS. 1 and 2. FIG. 1 is a schematic diagram showing a basic configuration of a MRAM 100. FIG. 2 is an enlarged view schematically showing a memory element 200 and a magnetization inversion mechanism 300 making up the MRAM 100.

The MRAM 100 includes an interlayer insulating film formed on a semiconductor substrate, not depicted therein, making up a transistor structure. The interlayer insulating film has formed therein, in grid form, a multiplicity of memory elements 200 and a magnetization inversion mechanism 300 functioning as means for writing and reading information into and from each memory element. A write line constituting a magnetization inversion mechanism, which is arranged on both sides of each memory element in the drawings, may alternatively be arranged only on one side thereof.

Each memory element 200 includes a first magnetic film 201 having a thickness of 10 nm making up a vertical magnetized film of $Tb_{19}(Fe_{50}Co_{50})_{81}$, a nonmagnetic film (tunneling film) 202 of aluminum oxide having a thickness of 2 nm, and a second magnetic film 203 having a thickness of 10 nm making up a vertical magnetized film of $Gd_{20}(Fe_{50}Co_{50})_{80}$, which films are sequentially stacked to constitute a tunneling magnetoresistive (TMR) film. The electrical resistance along the stack is varied depending on the relative angle of direction of magnetization between the first magnetic film 201 and the second magnetic film 203. The first magnetic film 201 is magnetized vertically upward in FIG. 2 and has a larger coercive force than the second magnetic film 203. Thus, the magnetization of the first magnetic film 201 are not reversed by the magnetic field applied by the magnetization inversion mechanism 300.

The magnetization inversion mechanism 300 includes a plurality of conductor wires (write lines) 301 arranged in parallel to each other at predetermined intervals and a plurality of conductor wires (bit lines) 302 arranged in parallel to each other at predetermined intervals in the direction orthogonal to the write lines 301 and electrically connected with the memory elements. Specifically, the write lines 301 and the bit lines 302 are arranged in matrix (grid). Further, the magnetization inversion mechanism 300 includes a plurality of magnetic field application sections 303 arranged at intersections between the write lines 301 and the bit lines 302. Expediently, the magnetic application sections 303 are not shown in FIG. 1, and the bit lines 302 are not shown in FIG. 2. Also, though not shown, this configuration also includes a power unit for supplying a current to the write lines and the bit lines. The peripheral circuit not shown in FIGS. 1 and 2 can be configured by the well-known technique used for the conventional MRAM and other semiconductor memories.

The write lines 301 are divided into a plurality of pairs of each two adjacent write lines 301 between which a plurality of memory elements 200 are aligned vertically along the adjacent write lines 301. At least a pair of the write lines 301a and 301b are arranged in parallel to each other with a forming area 304 therebetween where the memory elements 200 can be formed. Also, the two write lines 301a and 301b making up each pair are supplied with the write current in opposite directions.

The bit lines 302 are wired across the top of a plurality of the memory elements 200 arranged in the direction along the bit lines 302 and electrically connected o the second magnetic film 302 of each memory element 200.

The magnetic field application section 303 is substantially channel-shaped and includes a back surface section 305 erected in contact with the back surface of the write line 301 (the surface of the forming area 304 far from the surface thereof opposed to the memory element 200), an upper surface section 306 extending in the direction at right angles from the upper end of the back surface section 305 toward the forming area 304 into contact with the upper surface of the write line 301, and a lower surface section 307 extending at right angles from the lower end of the back surface section 305 toward the forming area 304 into contact with the lower surface of the write line 301. Further, the end portion of each of the upper surface section 306 and the lower surface section 307 is projected into the forming area 304 beyond the write line 301.

Further, an application protrusion 308 is projected into the forming area 304 at the end portions of the upper surface section 306 and the lower surface section 307 projected into the forming area 304. The application protrusion 308a formed on the upper surface section 306 and the application protrusion 308b formed on the lower surface section 307 are opposed to each other with the memory element 200 formed therebetween in the forming area 304. The application protrusions 308a and 308b each are sharpened progressively thinner toward each other.

Once a write current is supplied to the pair of the write lines 301a, 301b and the bit lines 302, a resultant magnetic field is generated near each intersection of these lines. The magnetic field thus generated is applied in the direction at right angles to a specific memory element 200 through the magnetic field application section 303 arranged at the particular intersection. In the process, a greater number of magnetic lines of force are concentrated at the sharp application protrusions 308 than the other parts, and therefore the magnetic flux density near each application protrusion 308 becomes relatively high. Thus, a stronger magnetic field is generated near the application protrusion 308 than the other parts. As a result, a magnetic field is applied to the whole surface of the memory element 200, and a stronger magnetic field is applied to the part of the surface near the application protrusion 308 than the other parts of the surface. As a result, even with a write current weaker than in the related art, a magnetic field is applied sufficient to form a magnetic domain for inducing the magnetization inversion of the whole of the second magnetic film 203 of the memory element 200. The magnetic field generated by the write current supplied to the bit lines 302 has no direct effect on the direction of magnetization of the second magnetic film 203, but has the function to reinforce the magnetic field generated by the write current supplied to the write lines 301a, 302a and thereby to secure the magnetization inversion of the second magnetic film 203. According to this embodiment, the magnetic field application section and the write lines, though plotted as separate entities, may be formed integrally. When the magnetic field application section and the write lines are fabricated as separate entities, on the other hand, the magnetic field application section or especially each application protrusion 308 is desirably fabricated of a material of higher magnetic permeability than the write lines. Also, the application protrusions, which are provided both upper and lower parts, may alternatively be arranged only near the magnetic film intended for magnetic flux reversal.

Second Embodiment

Figure 3:
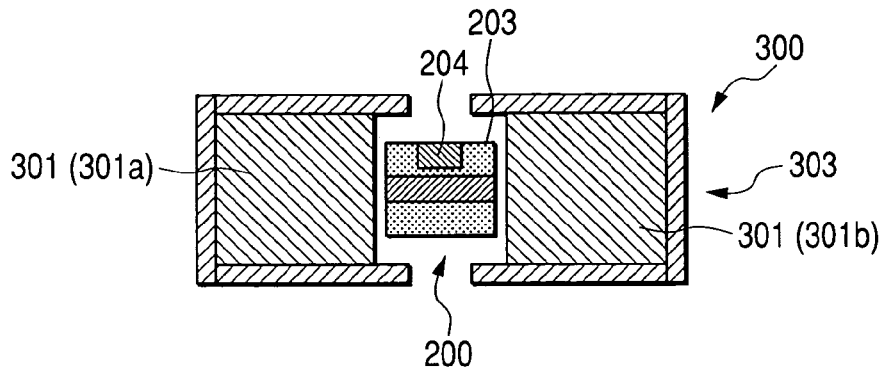
FIG. 3 is an enlarged sectional view schematically showing a plurality of memory elements and a magnetization inversion mechanism making up the magnetic random access memory according to another embodiment of the invention.

A magnetic random access memory according to another most preferred embodiment of the invention is explained with reference to FIG. 3. FIG. 3 is an enlarged view schematically showing the memory element 200 and the magnetic flux reversal mechanism 300 making up the magnetic random access memory.

The memory element 200 and the magnetic flux reversal mechanism 300 making up the magnetic random access memory have the same basic configuration as the corresponding component parts shown in FIGS. 1 and 2. Therefore, the same component parts as those shown in FIGS. 1 and 2 are designated by the same reference numerals, respectively, in FIG. 3.

The second magnetic film 203 of the memory element 200 is locally formed to have a portion (easily magnetized section 204) magnetized more easily than the other portions. This easily magnetized section 204 is where the vertical magnetic anisotropy is reduced by changing the film structure of a part of the second magnetic film 203. The strength of the magnetic field required to reverse the magnetization of a magnetic film is proportional to the vertical magnetic anisotropy of the particular magnetic film. The easily magnetized section 204 smaller in vertical magnetic anisotropy than the other parts is reversed the magnetization therein even by a weaker magnetic field than that for magnetic inversion of the other parts.

The magnetic field application section 303 of the magnetization inversion mechanism 300 shown in FIG. 3 has no application protrusion 308 shown in FIG. 2. The magnetic field generated by the write current supplied to the write lines 301a, 301b and the bit lines not depicted therein, therefore, is applied substantially uniformly to the whole of the memory element 200 through the magnetic field application section 303, and unlike in the first embodiment, the locally strong magnetic field is not applied to the second magnetic film 203. The second magnetic film 203 of the memory element 200 shown in FIG. 3, however, is formed to have an easily magnetized section 204 having the above-mentioned characteristic. Even when the write current is smaller than in the related art and the strength of the magnetic field applied to the memory element 200 is not sufficient to reverse the magnetization of the parts other than the easily magnetized section 204, therefore, the magnetic domain can be formed in the second magnetic film 203 and the magnetization inversion of the whole second magnetic film 203 is induced, as long as a sufficient strength of the magnetic field is secured to cause the magnetization inversion of the easily magnetized section 204.

A method of locally forming a part having a relatively small vertical magnetic anisotropy in the second magnetic film 203 of the memory element 200 conceivably includes a method of locally changing the film structure of the second magnetic film 203 under the heat of the laser beam radiation. When the magnetic characteristics are changed by radiating the laser beam on the whole surface of the second magnetic film 203, however, the second magnetic film 203 would lose the vertical magnetic anisotropy, thereby making it impossible to hold the recorded information. Nevertheless, the means for locally reducing the vertical magnetic anisotropy of the second magnetic film 203 is not limited to the heating by laser beam radiation.

Figure 4:
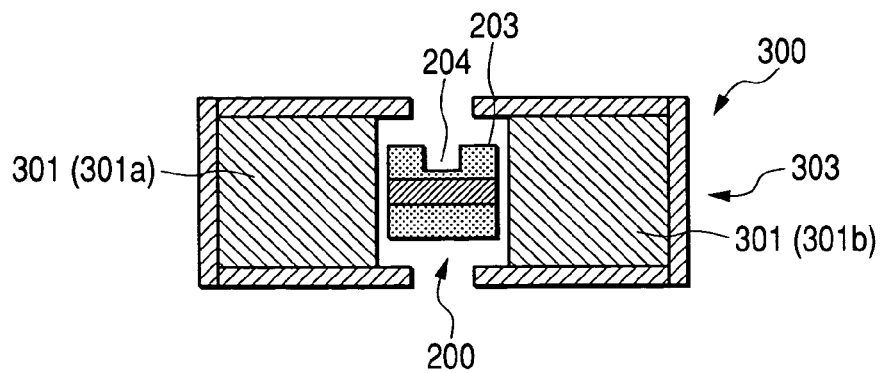
FIG. 4 is an enlarged sectional view schematically showing a plurality of memory elements and a magnetization inversion mechanism making up the magnetic random access memory according to still another embodiment of the invention.
Figure 5:
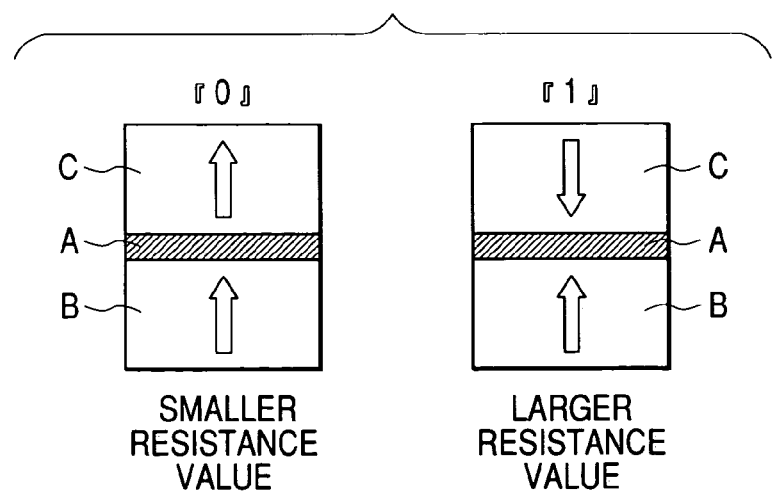
FIG. 5 is a sectional view schematically showing the relationship between the direction of magnetization of a magnetoresistive film and the resistance value.
Figure 6A:
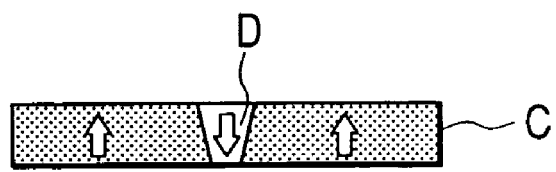
FIGS. 6A, 6B and 6C are sectional views schematically showing the magnetization inversion mechanism of a magnetic film.
Figure 6B:
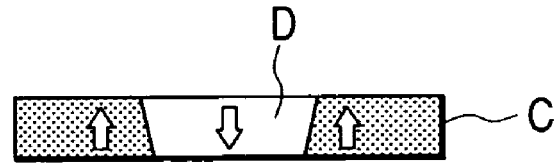
Figure 6C:
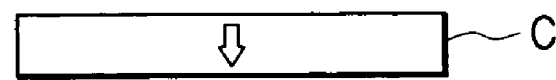

In the presence of a thin portion of the magnetic film, the particular portion is impressed with a stray magnetic field from the surrounding in the direction opposite to the direction of magnetization. When the magnetic field is applied in the direction opposite to the direction of magnetization, therefore, the magnetic fluxes in the thin film portion are reversed by a magnetic field weaker than the magnetic field applied to the other portions. Thus, as shown in FIG. 4, the easily magnetized section 204 can be formed by reducing the thickness of the desired portion of the second magnetic film 203 relatively as compared with the thickness of the other portions. An example of locally reducing the thickness of the second magnetic film 203 is by radiating a focused ion beam.

Although the magnetic field application section is depicted in the drawings, the magnetization can be reversed only by the magnetic field induced by the write lines without the magnetic field application section. When the magnetic field application section is provided, a material of higher magnetic permeability than the write lines is desirably used.

Third Embodiment

A method of magnetization inversion of the magnetic film according to a third embodiment is explained. Normally, a uniform magnetic field is applied from the write lines for the magnetic flux reversal of the magnetic film of the MRAM. According to this embodiment, in contrast, the magnetic field is applied to the whole of the magnetic film, while at the same time applying a stronger magnetic field than the above-mentioned magnetic field to a part of the magnetic film thereby to magnetize the magnetic film in the same direction as the direction of the stronger magnetic field. This method makes it possible to save power without increasing the size of the cell structure in the magnetization inversion method for the MRAM. This configuration can be implemented either by appropriately designing the magnetic field application mechanism explained in the first embodiment or by locally processing the magnetic film. Also, this method is applicable to both the vertical magnetized film or the in-plane magnetized film regardless of the direction of magnetization of the magnetic film.

This invention is not limited to the above embodiments but can be also configured of an appropriate combination of the embodiments. By forming an easily magnetized section at a part corresponding to the application protrusion of the first embodiment, for example, the magnetic field can be reversed by application of a still smaller magnetic field. Also, by reducing both the vertical magnetic anisotropy and the thickness of the magnetic film, the magnetic fluxes can be reversed by application of a yet smaller magnetic field.

This application claims priority from Japanese Patent Application No. 2003-311307 filed Sep. 3, 2003, which is hereby incorporated by reference herein.

What is claimed is:

1. A magnetization inversion mechanism of a magnetic film, comprising at least a conductive wire and at least a magnetic field application section for applying the magnetic field generated by the current supplied to the conductive wire to the magnetic film, wherein the magnetic field application section has a sharp application protrusion for locally applying the generated magnetic field to a part of the magnetic film.

2. A magnetization inversion mechanism according to claim 1, wherein at least two magnetic films are stacked and sandwich a nonmagnetic film inserted therebetween.

3. A magnetic random access memory comprising at least a plurality of memory elements formed of a magnetoresistive film having a plurality of magnetic films stacked and the magnetization inversion mechanism according to claim 1 for applying a magnetic field to each of the memory elements thereby magnetizing the memory element in the same direction as the applied magnetic field.

* * * * *